(12) United States Patent
Matsumoto et al.

(10) Patent No.: US 8,150,073 B2
(45) Date of Patent: Apr. 3, 2012

(54) IMPEDANCE CONVERTING CIRCUIT AND ELECTRONIC DEVICE

(75) Inventors: Kazuya Matsumoto, Kanagawa-ken (JP); Hiroshi Suzunaga, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1397 days.

(21) Appl. No.: 11/697,524

(22) Filed: Apr. 6, 2007

(65) Prior Publication Data

US 2007/0236252 A1 Oct. 11, 2007

(30) Foreign Application Priority Data

Apr. 7, 2006 (JP) ................................. 2006-106621

(51) Int. Cl.
*H04R 3/00* (2006.01)
(52) U.S. Cl. .......... 381/113; 381/91; 381/122; 330/288; 330/296
(58) Field of Classification Search .......... 381/111–115, 381/120, 91, 122; 333/17.1, 17.3, 32, 124; 330/261, 275, 296, 288, 110, 144
See application file for complete search history.

(56) References Cited

U.S. PATENT DOCUMENTS

| | | | | | |
|---|---|---|---|---|---|
| 4,374,363 | A | * | 2/1983 | Previti | 330/263 |
| 4,450,413 | A | * | 5/1984 | Fujibayashi | 330/279 |
| 5,097,224 | A | * | 3/1992 | Madaffari et al. | 330/277 |
| 6,266,423 | B1 | * | 7/2001 | Werrbach | 381/108 |
| 6,453,048 | B1 | * | 9/2002 | Akino | 381/113 |
| 7,110,506 | B2 | * | 9/2006 | Radley et al. | 378/141 |
| 7,372,967 | B2 | * | 5/2008 | Henson et al. | 381/111 |

FOREIGN PATENT DOCUMENTS

| | | |
|---|---|---|
| JP | 7-120672 | 12/1995 |
| JP | 8-182092 | 7/1996 |
| JP | 2003-243944 | 8/2003 |
| JP | 2004-23621 | 1/2004 |

OTHER PUBLICATIONS

Arie van Rhijn, "Integrated Circuits for High Performance Electret Microphones", Audio Engineering Society, Convention Paper, Presented at the 114$^{th}$ Convention, Mar. 22-25, 2003, Amsterdam, The Netherlands, pp. 1-7.

* cited by examiner

*Primary Examiner* — Xu Mei
(74) *Attorney, Agent, or Firm* — Oblon, Spivak, McClelland, Maier & Neustadt, L.L.P.

(57) ABSTRACT

A semiconductor circuit including an input terminal, an impedance converting portion configured to receive an input signal from the input terminal and to output an output signal corresponding to the input signal, an input impedance of the semiconductor circuit being higher than an output impedance of the semiconductor circuit, a detecting portion connected to a node between the input terminal and the impedance converting portion, and configured to detect whether the input signal is higher than a predetermined threshold, and a variable impedance connected to a reference voltage and the node, an impedance of the variable impedance configured to decrease after the input signal is detected as higher than the predetermined threshold.

12 Claims, 6 Drawing Sheets

IMPEDANCE CONVERTING CIRCUIT AND ELECTRONIC DEVICE

CROSS REFERENCE TO RELATED APPLICATION

This application is based upon and claims the benefit of priority from Japanese Patent Application No. P2006-106621, filed on Apr. 7, 2006, the entire contents of which are incorporated herein by reference.

BACKGROUND OF THE INVENTION

Field of the Invention

The present invention is directed to an impedance converting circuit, and an electronic device including the impedance circuit, which for example may be connected to a microphone, and which operates to decrease an impedance of an input from the microphone.

In a cellular phone, a hearing aid, or an electronic device, a condenser microphone is used. Such a condenser microphone is connected to an impedance converting circuit. In a case that a loud voice or a large mechanical impact is provided to the electronic device, for example if a cellular phone is dropped on the ground, the signal input to the impedance converting circuit has an excessive amplitude.

In that instance, the impedance converting circuit is subject to an irregular condition, and some time is needed to return to a normal operation condition. A resistance may be connected between the input of the impedance converting circuit and ground (GND). However, a resistance having about some $G\Omega$ is required for a microphone usable in the 20 Hz-20 kHz range, which corresponds to the voice band. However, the larger the resistance, the longer the recovery time to return to the normal operation condition.

SUMMARY OF THE INVENTION

Aspects of the present invention relate to an improved impedance converting circuit and electronic device.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings.

DETAILED DESCRIPTION OF THE PREFERRED EMBODIMENTS

Various connections between elements are hereinafter described. It is noted that those connections are illustrated in general and, unless specified otherwise, may be direct or indirect and that this specification is not intended to be limiting in that respect.

Embodiments of the present invention will be explained with reference to the drawings as next described, wherein like reference numerals designate identical or corresponding parts throughout the several views.

In one aspect of the present invention, a semiconductor circuit includes an input terminal, an impedance converting portion configured to receive an input signal from the input terminal and to output an output signal corresponding to the input signal, an input impedance of the semiconductor circuit being higher than an output impedance of the semiconductor circuit, a detecting portion connected to a node between the input terminal and the impedance converting portion, configured to detect whether the input signal is higher than a predetermined threshold, and a variable impedance connected to a reference voltage and the node, an impedance of the variable impedance configured to decrease after the input signal is detected as higher than the predetermined threshold.

In another aspect of the invention, a semiconductor circuit includes an input terminal, an impedance converting portion configured to receive an input signal from the input terminal and to output an output signal corresponding to the input signal, an input impedance of the semiconductor circuit being higher than an output impedance of the semiconductor circuit, a detecting portion connected to a node between the input terminal and the impedance converting portion, and configured to detect whether the input signal is higher than a predetermined threshold, and a recovery portion connected to a reference voltage and the node, including a current mirror circuit connected to the node and the reference voltage, the recovery portion configured to increase a current to the current mirror circuit after the signal is detected as higher than the predetermined threshold.

In another aspect of the invention, an electronic device includes a microphone and a semiconductor circuit connected to the microphone, the semiconductor circuit including an input terminal, an impedance converting portion configured to receive an input signal input from the input terminal and to output an output signal corresponding to the input signal, an input impedance of the semiconductor circuit being higher than an output impedance of the semiconductor circuit, a detecting portion connected to a node between the input terminal and the impedance converting portion, and configured to detect whether the input signal is higher than a predetermined threshold, and a variable impedance connected to a reference voltage and the node, an impedance of the variable impedance configured to decrease after the input signal is detected as higher than the predetermined threshold.

Figure 1:
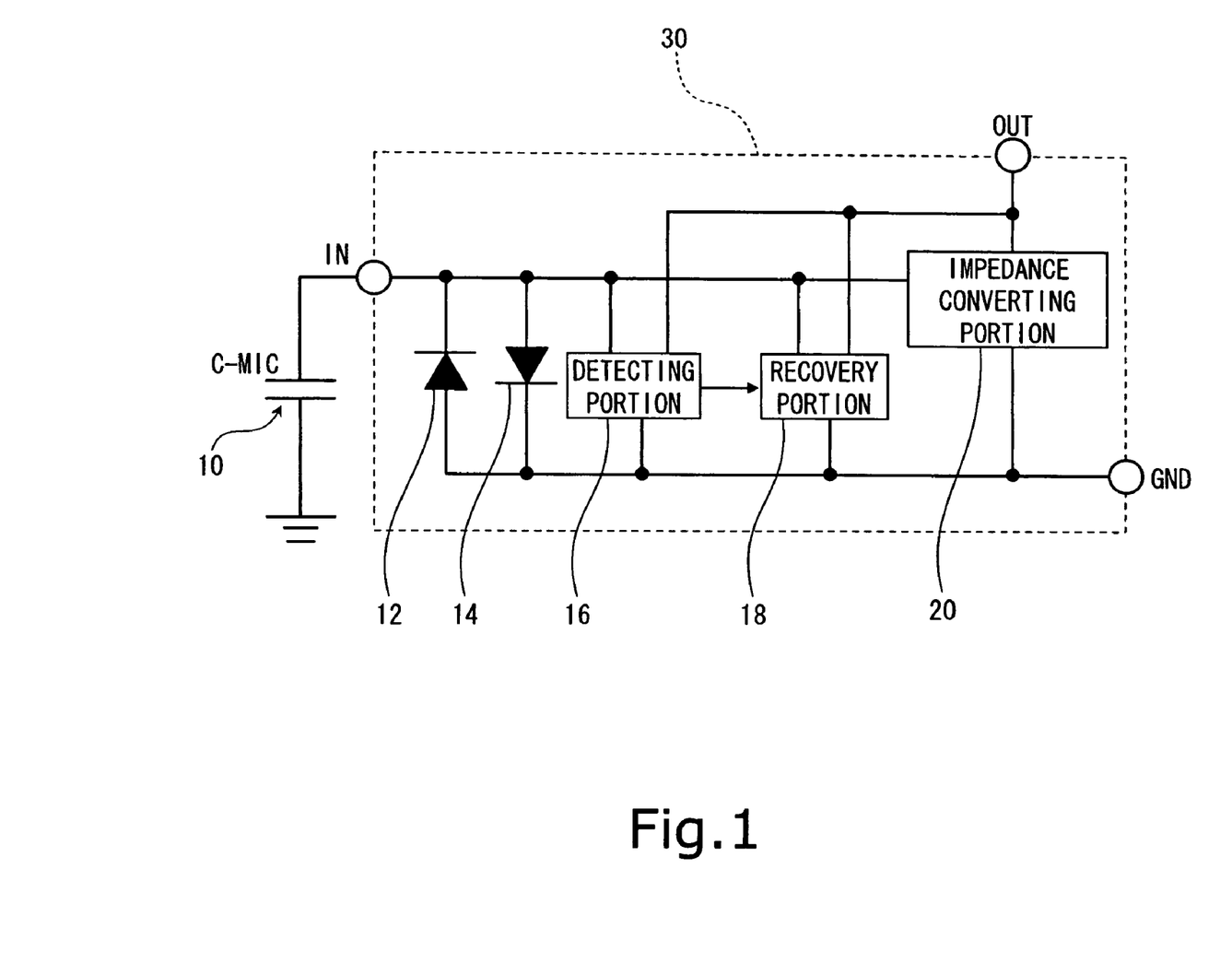
FIG. 1 is a block diagram of a semiconductor circuit having an impedance converting portion in accordance with an embodiment of the present invention.

A first embodiment of the present invention will be explained hereinafter with reference to FIG. 1. FIG. 1 is a block diagram of a semiconductor circuit 30 having an impedance converting portion 20 in accordance with an embodiment of the present invention.

As shown in FIG. 1, a condenser microphone 10 is connected to an input terminal IN of the semiconductor circuit 30 and GND. The capacitance of the condenser microphone 10 may be small, such as 5 pF. A pair of inverse connected diodes 12 and 14 is connected to the input terminal IN and GND. The diodes 12 and 14 may function as an ESD (electric static discharge) protective element. That is, the diodes 12 and 14 may function as a clamp against an excessive input.

The input signal from the input terminal IN is input to an impedance converting portion 20. The impedance converting portion 20 is connected to the output terminal OUT of the semiconductor circuit 30 and GND. The impedance converting portion 20 functions as an impedance converter. Namely, the input impedance of the semiconductor circuit 30 is higher than the output impedance of the semiconductor circuit 30.

The input terminal of the impedance converting portion 20 is connected to the input terminal IN of the impedance converting circuit 30. Thereby, the input impedance of the impedance converting portion 20 corresponds to the input impedance of the impedance converting circuit 30.

The output terminal of the impedance converting portion 20 is connected to the output terminal OUT of the impedance converting circuit 30. Thereby, the output impedance of the impedance converting portion 20 corresponds to the output impedance of the impedance converting circuit 30.

As an example, the impedance converting portion 20 may simply be a MOSFET, in which a gate is connected to the input terminal IN, a source is connected to GND, and a drain is connected to the output terminal OUT. A MOSFET may be preferable, since an input capacitance thereof $C_{IN}$ is small.

A detecting portion 16 is connected to the input terminal IN and the impedance converting portion 20. The detecting portion 16 is also connected to GND and the output terminal OUT.

A recovery portion 18 is connected to the input terminal IN and the impedance converting portion 20. The recovery portion 18 is also connected to GND and the output terminal OUT. The recovery portion 18 receives a signal from the detecting portion 16. The recovery portion 18 functions as a variable impedance between the input terminal of the impedance converting portion 20 and the GND.

The present invention can operate to decrease an impedance from a large input from the microphone 10 to a smaller impedance needed for a next circuit to which the impedance converting circuit 30 is connected at its output terminal OUT. In a normal operation, a large impedance is present from the input terminal IN to GND. However, with such a large impedance if an abnormally high input is provided from the microphone, for example from a very loud voice or a cell phone being dropped, the impedance converting circuit 30 enters into an abnormal operation state, and that high impedance would lengthen the recovery time for the circuit to enter back into a normal operation state. Thereby, in that situation in which the input signal from the microphone is at a large amplitude, i.e. exceeds a predetermined threshold, the impedance converting circuit 30 of the present invention operates to lower the impedance from the input terminal IN to the GND, and that thereby reduces the recovery time for the impedance converting circuit 30 to return to a normal operation condition.

Thereby, in a case that the input signal from the input terminal IN is less than a predetermined threshold, as detected by the detecting portion 16, the impedance of the recovery portion 18 is high so as to improve noise characteristics and cutoff frequency at a low frequency. The predetermined threshold may be set at a level of the input signal when a loud sound or mechanical impact is present on the input signal.

In a case that the input signal from the input terminal IN is equal to or greater than the predetermined threshold, the output signal from the output terminal OUT is distorted. In such a case, the impedance of the recovery circuit 18 is set to be low so as to return to a normal operation quickly. If the impedance of the recovery circuit 18 was still high, a long recovery time to the normal operation would be needed. However, in a case the impedance is low, the time constant for returning to a normal operation, which is decided by the capacitance and the transition impedance of the recovery portion 18, is low. Thereby, the semiconductor circuit 30 of this embodiment of the present invention returns to the normal operation quickly.

Thereby, in the operation of the circuit of the present invention, when an excessive signal is input from the input terminal IN, the detecting portion 16 outputs a signal to the recovery portion 18. After the signal is received by the recovery portion 18, the impedance of the recovery portion 18 is decreased. In other words, after the signal is input to the recovery portion 18, the impedance between the input terminal IN of the impedance converting portion and reference level GND is decreased. Thereby, the recovery time is reduced.

In the normal operation when the signal from the input terminal IN is less than the predetermined threshold, the impedance between the input terminal IN and the reference voltage GND is set to be high such that the cutoff frequency of the semiconductor circuit 30 is lower than the lower limit of the voice band. Thereby, noise characteristics may be improved. A semiconductor circuit, which has an improved recovery time after an excessive signal is input and with good noise characteristics, may thus be obtained.

FIG. 1 shows the basic structure of the embodiment of the present invention including the detecting portion 16, recovery portion 18, and impedance converting portion 20. In the following embodiments in FIGS. 2, 4, 5, and 6, specific detailed embodiments of the detecting portion 16 and recovering portion 18 are provided.

Figure 2:
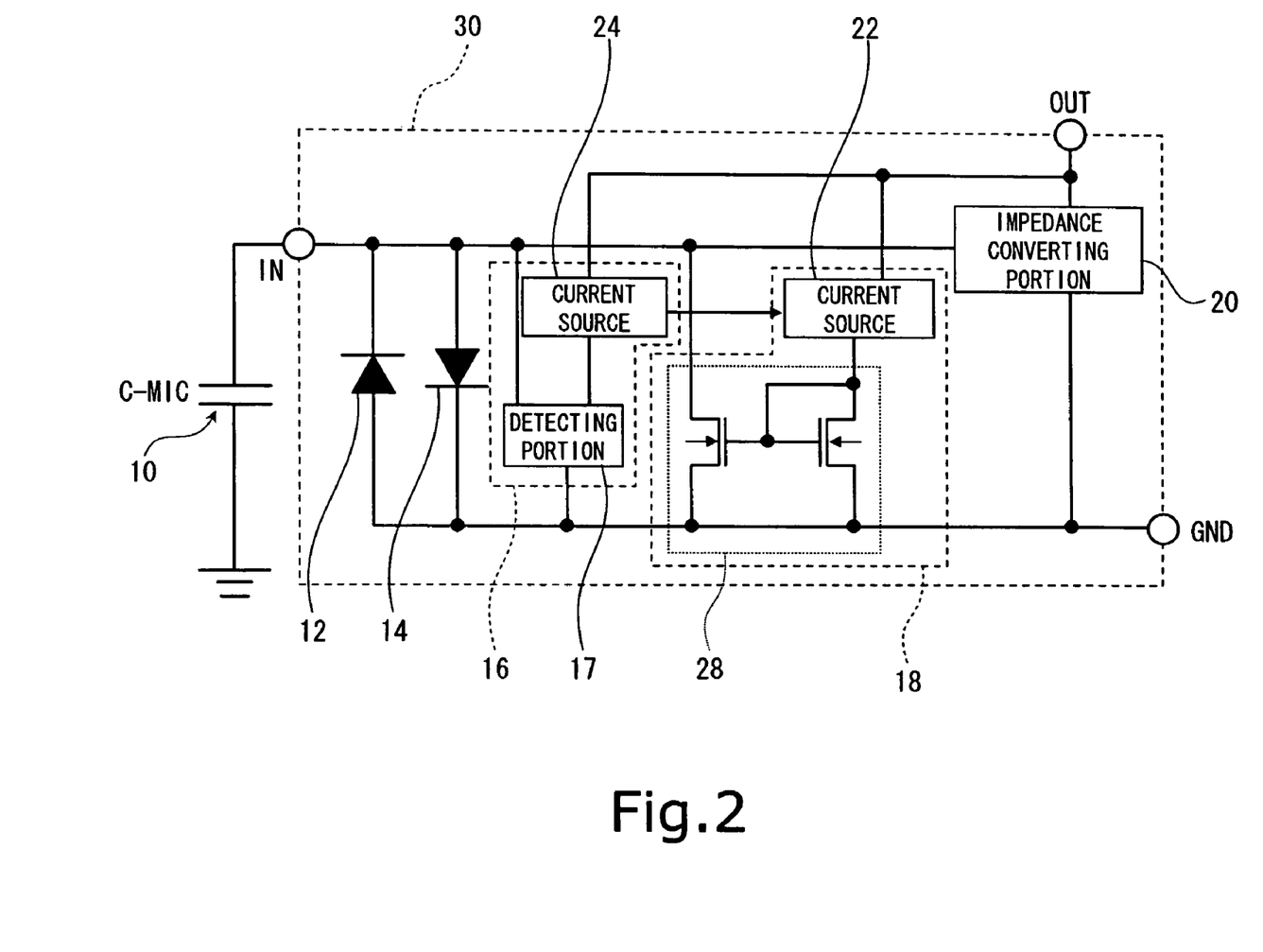
FIG. 2 is a block diagram of a semiconductor circuit having an impedance converting portion in accordance with an embodiment of the present invention.

Details of an embodiment of a semiconductor circuit 30 having an impedance converting portion 20 is described in accordance with an embodiment of the present invention as shown in FIG. 2.

As shown in FIG. 2, the recovery circuit 18 includes a first current mirror circuit 28 and a first current source 22. The detecting portion 16 includes a detecting circuit 17 and a second current source 24.

The first current circuit 28 is constituted by MOS transistors. The diodes 12 and 14 may be diode connected MOS transistors.

In a case that the input signal is less than the predetermined threshold, a small constant current is supplied to the current mirror circuit 28, and the current mirror circuit 28 is operated in an unsaturated region. Thereby, the recovery portion 18 is at a high impedance.

On the other hand, in a case that the input signal is equal to or greater than the predetermined threshold, that input signal is detected by the detecting circuit 17 as greater than the predetermined threshold, and a current supplied from the first current source 22 to the first current mirror circuit 28 is increased. The first current mirror circuit 28 is then operated in a saturated region. Thereby, the impedance of the recovery portion 18 is decreased transitionally, and the recovery time to a normal operation may be shortened. The excessive input may also be detected from the output signal of the impedance converting portion 20.

Figure 3:
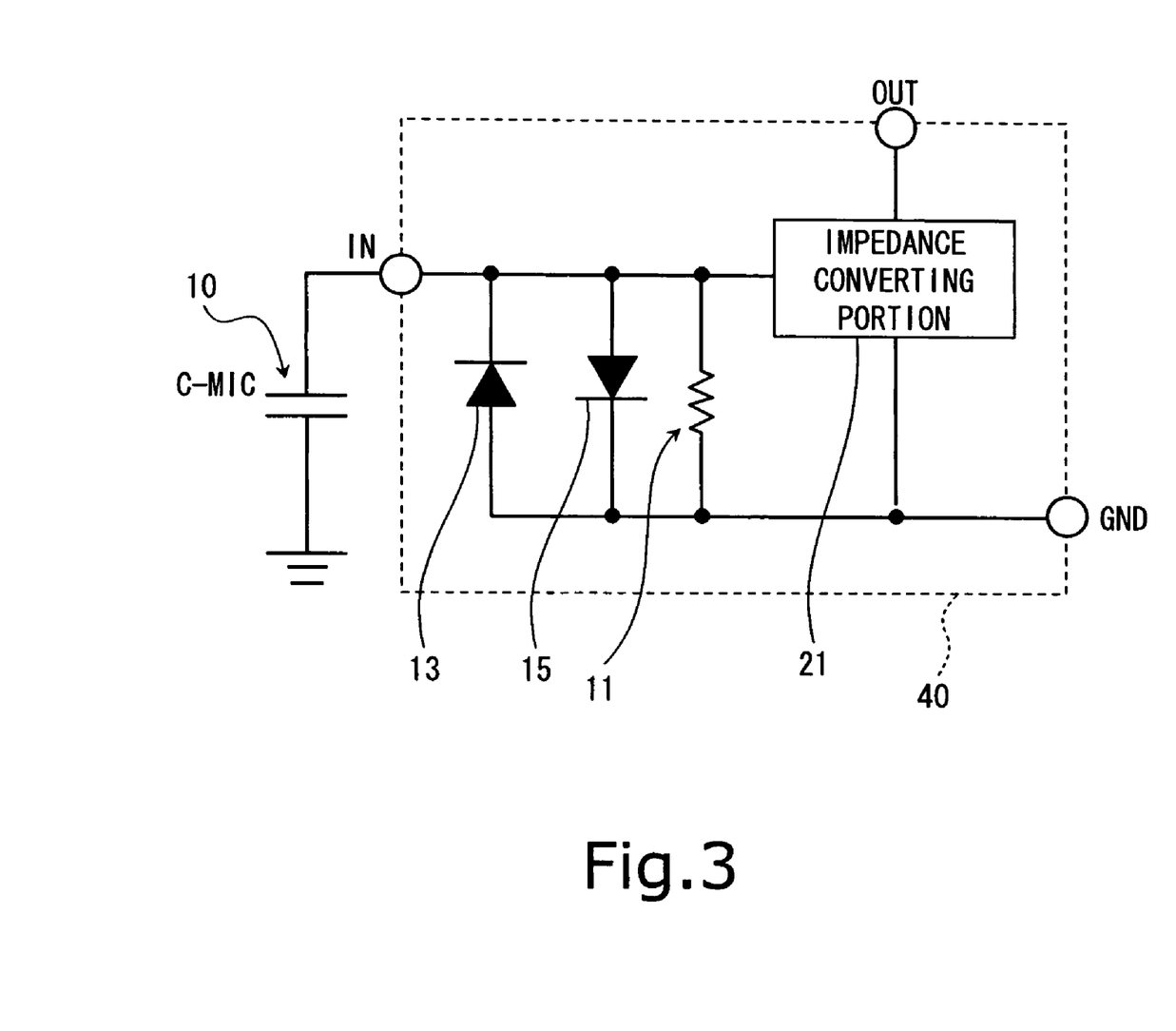
FIG. 3 is a block diagram of a semiconductor circuit having an impedance converting portion in accordance with a comparative example.

A comparative example is explained hereinafter with reference to FIG. 3. FIG. 3 is a block diagram of a semiconductor circuit 40 having an impedance converting portion 21 in accordance with a comparative example that does not include the detecting portion 16 or recovery portion 18.

In FIG. 3 the condenser microphone 10 is connected to the input terminal IN of the semiconductor circuit 40. A pair of inverse parallel diodes 13 and 14 is connected between the input terminal IN and GND. A resistance 11, of some GΩ, is provided between the input terminal IN and the GND. The resistance 11 requires a large area in a semiconductor chip. In this comparative example, the resistance value between the input terminal IN and the GND is constant. Thereby, the resistance value can not be reduced.

A further embodiment of the present invention is explained with reference to FIG. 4.

Figure 4:
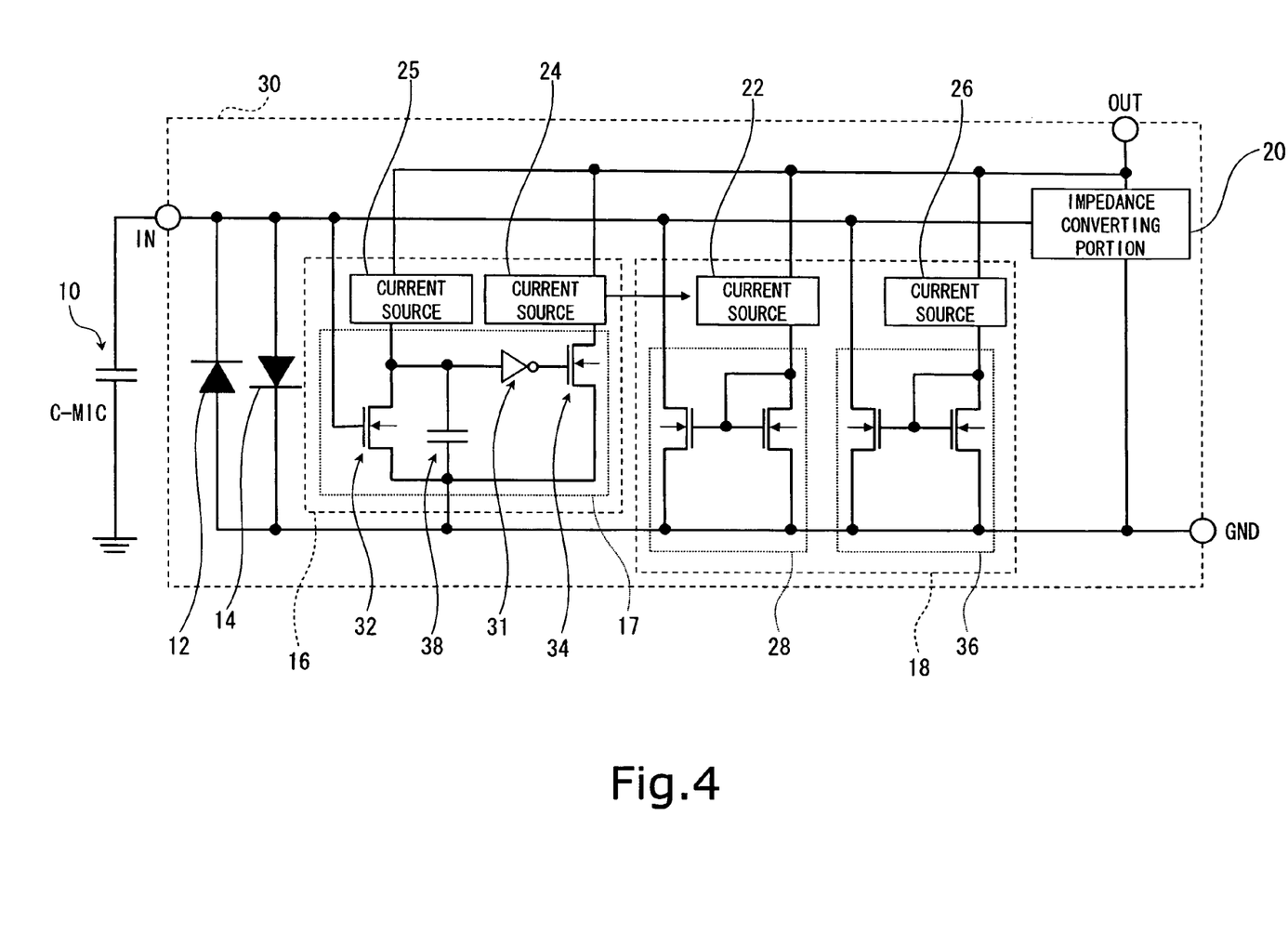
FIG. 4 is a block diagram of a semiconductor circuit having an impedance converting portion in accordance with an embodiment of the present invention.

As shown in FIG. 4, in this further embodiment the recovery circuit 18 includes the first current mirror circuit 28, a first current source 22, a second current mirror circuit 36, and a fourth current source 26. The second current mirror circuit 36 is connected to the input terminal of the impedance converting portion 29 and GND. The fourth current source 26 is connected to the second current mirror circuit 36 and supplies a current to the second current mirror circuit 36.

The detecting portion 16 includes the detecting circuit 17, a second current source 24, and a third current source 25.

The detecting circuit 17 includes an NMOS transistor 32, a condenser 38, a CMOS inverter circuit 31, and an NMOS transistor 34.

In this further embodiment of FIG. 4, in a case that the input signal is less than the predetermined threshold, a small constant current is supplied to the current mirror circuits 28 and 36, and the current mirror circuits 28 and 36 are operated in an unsaturated region. Thereby, the recovery portion 18 has a high impedance.

In a case that an excessive input signal of a same polarity as the driving voltage of the NMOS transistor 32 is input, the NMOS is turned ON and the NMOS transistor 34 is driven by the inverter 31. A current supplied to the first current mirror circuit 28 is thus increased by current sources 22 and 24. Thereby, an impedance of the recovery portion 18 is decreased.

That is, after detecting the excessive input, the condenser 38 is discharged. During a time for charging the condenser 38 from the current source 25, the impedance of the recovery portion 18 is decreased and the impedance of the input terminal is decreased. After the condenser 38 is finished discharging, the current is not supplied from current source 24 to the first current mirror circuit 28. Thereby, the first current mirror circuit is returned to a normal operation and the impedance is increased. The recovery time may be changed by the capacitance of the condenser 38 and current from the third current source 25.

On the other hand, in a case that the excessive input signal is of a opposite polarity to the driving voltage of the NMOS transistor 32, the impedance of the input terminal IN is decreased by the second current mirror circuit 36. Thereby, the recovery time may be reduced. The recovery time may de changed by the gate voltage of the current mirror circuit 36.

A further embodiment of the invention is explained with reference to FIG. 5.

Figure 5:
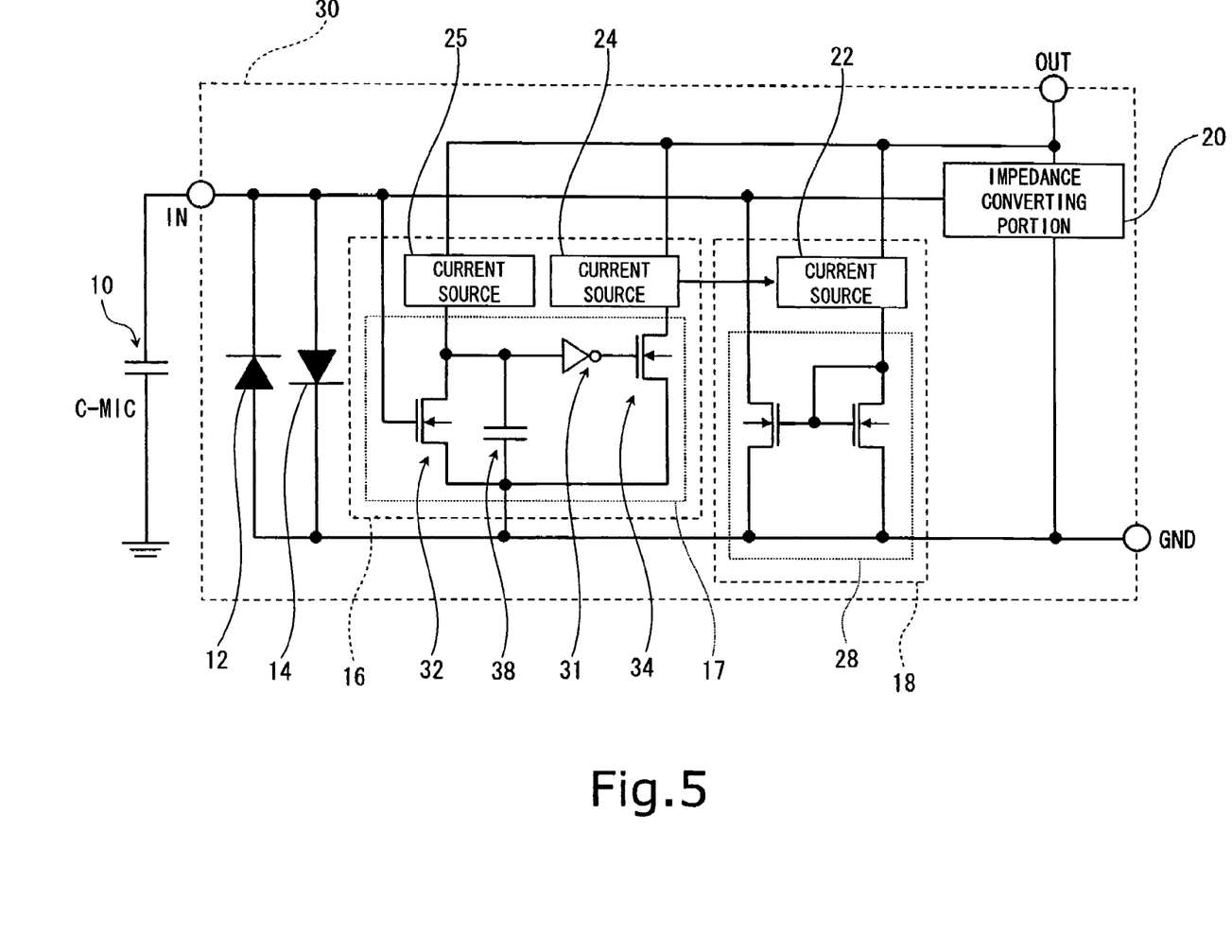
FIG. 5 is a block diagram of a semiconductor circuit having an impedance converting portion in accordance with an embodiment of the present invention.

In the further embodiment of FIG. 5, a semiconductor circuit 30 having an impedance converting portion 20 is as described in accordance with the embodiment of FIG. 4. In this further embodiment, the second current mirror circuit 36 and the fourth current source 26 are not provided.

The first current mirror circuit 28 may function as the variable impedance, when the excessive input signal is of the opposite polarity to the driving voltage of the NMOS transistor 32.

Figure 6:
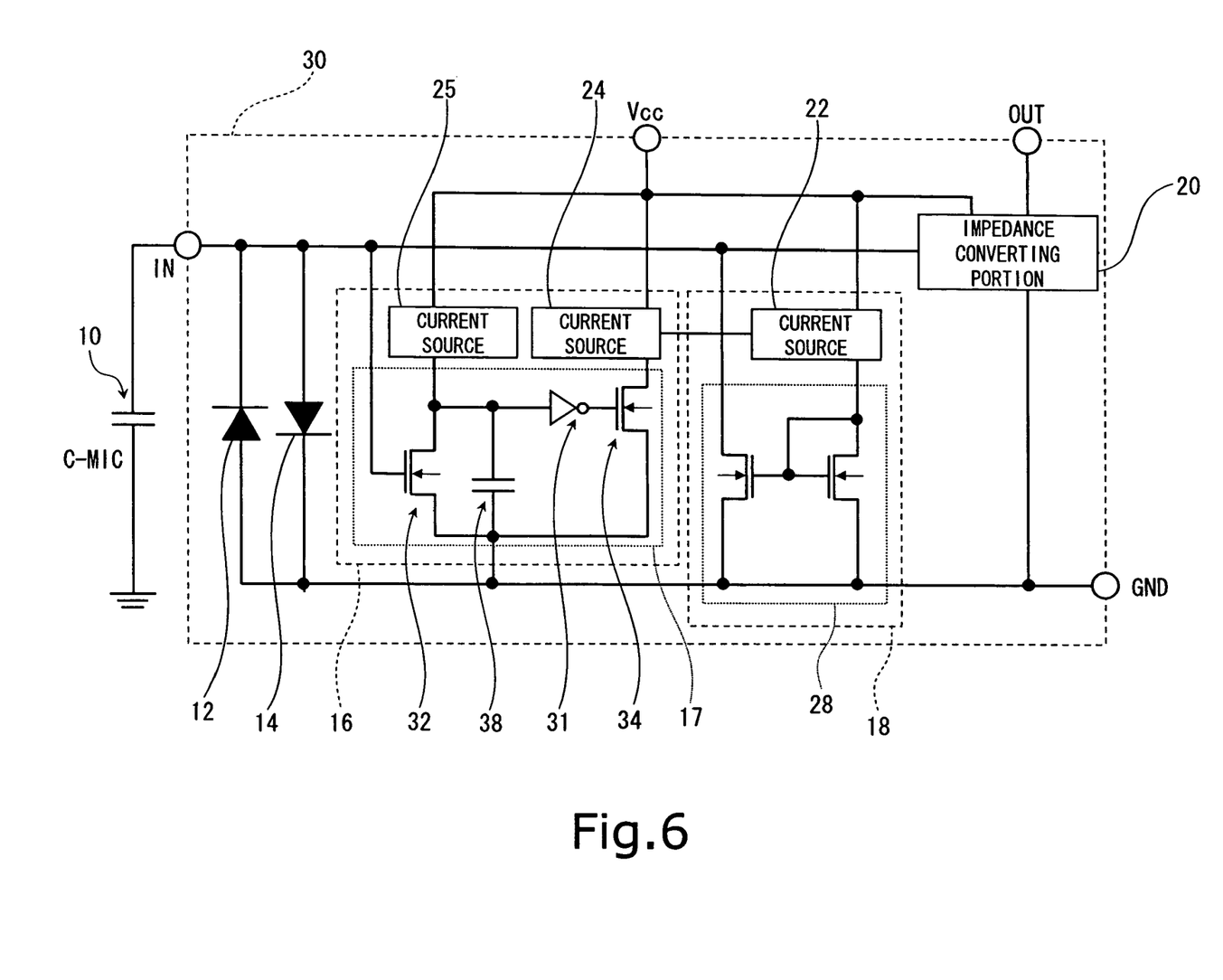
FIG. 6 is a block diagram of a semiconductor circuit having an impedance converting portion in accordance with a modification of an embodiment of the present invention.

In a modification of the further embodiment of FIG. 5, as shown in FIG. 6, a voltage terminal Vcc for the current sources 25, 26 may be provided as another terminal to the output terminal OUT.

Embodiments of the invention have been described with reference to the examples. However, the invention is not limited thereto.

For example, the condenser microphone may be MEMS microphone or the like.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the following.

The invention claimed is:

1. A semiconductor circuit, comprising:
   an input terminal;
   an impedance converting portion configured to receive an input signal from the input terminal and to output an output signal corresponding to the input signal, an input impedance of the semiconductor circuit being higher than an output impedance of the semiconductor circuit;
   a detecting portion connected to a node between the input terminal and the impedance converting portion, and configured to detect whether the input signal is higher than a predetermined threshold; and
   a recovery portion connected to a reference voltage and the node, and including a current mirror circuit connected to the node and the reference voltage, the recovery portion configured to increase a current to the current mirror circuit after the input signal is detected as higher than the predetermined threshold.

2. A semiconductor circuit of claim 1, wherein an impedance of the current mirror circuit when the input signal is detected as higher than the predetermined threshold is lower than an impedance of the current mirror circuit when the input signal is detected as lower than the predetermined threshold.

3. A semiconductor circuit of claim 1, wherein the recovery circuit includes a current source supplying a current to the current mirror circuit.

4. A semiconductor circuit of claim 3, further comprising a pair of inverse parallel connected rectifiers connected between the input terminal and the node.

5. An electronic device, comprising:
   a microphone; and
   a semiconductor circuit connected to the microphone, the semiconductor circuit including:
   an input terminal;
   an impedance converting portion configured to receive an input signal from the input terminal and to output an output signal corresponding to the input signal, an input impedance of the semiconductor circuit being higher than an output impedance of the semiconductor circuit;
   a detecting portion connected to a node between the input terminal and the impedance converting portion, and configured to detect whether the input signal is higher than a predetermined threshold; and
   a variable impedance connected to a reference voltage and the node, an impedance of the variable impedance configured to decrease after the input signal is detected as higher than the predetermined threshold,
   wherein the variable impedance includes a current mirror circuit connected to the node and the reference voltage.

6. An electronic device of claim 5, wherein the reference voltage is GND level.

7. An electronic device of claim 5, further comprising a pair of inverse parallel connected rectifiers connected between the input terminal and the node.

8. An electronic device of claim 6, further comprising a pair of inverse parallel connected rectifiers connected between the input terminal and the node.

9. An electronic device of claim 5, wherein an impedance of the current mirror circuit when the input signal is detected as higher than the predetermined threshold is lower than an impedance of the current minor circuit when the input signal is detected as lower than the predetermined threshold.

10. An electronic device of claim 5, wherein the variable impedance includes a current source supplying a current to the current mirror circuit.

11. An electronic device of claim 9, wherein the variable impedance includes a current source supplying a current to the current mirror circuit.

12. An electronic device of claim 11, further comprising a pair of inverse parallel connected rectifiers connected between the input terminal and the node.

* * * * *